United States Patent
Kimmlingen et al.

(10) Patent No.: US 8,963,548 B2
(45) Date of Patent: Feb. 24, 2015

(54) CYLINDRICAL GRADIENT COIL ARRANGEMENT FOR A MAGNETIC RESONANCE DEVICE

(71) Applicants: Ralph Kimmlingen, Zirndorf (DE); Andreas Krug, Fürth (DE)

(72) Inventors: Ralph Kimmlingen, Zirndorf (DE); Andreas Krug, Fürth (DE)

(73) Assignee: Siemens Aktiengesellschaft, München (DE)

( * ) Notice: Subject to any disclaimer, the term of this patent is extended or adjusted under 35 U.S.C. 154(b) by 122 days.

(21) Appl. No.: 13/783,293

(22) Filed: Mar. 2, 2013

(65) Prior Publication Data

US 2013/0229183 A1    Sep. 5, 2013

(30) Foreign Application Priority Data

Mar. 2, 2012 (DE) .......... 10 2012 203 338

(51) Int. Cl.
- *G01V 3/00* (2006.01)
- *G01R 33/34* (2006.01)
- *G01R 33/385* (2006.01)

(52) U.S. Cl.
CPC ........ *G01R 33/3403* (2013.01); *G01R 33/3856* (2013.01)
USPC .............................................. 324/322

(58) Field of Classification Search
CPC ........... G01R 33/3856; G01R 33/3815; G01R 33/3854; G01R 33/3804; G01R 33/385; G01R 33/3403; G01R 33/28
USPC ................................................ 324/300–322
See application file for complete search history.

(56) References Cited

U.S. PATENT DOCUMENTS

| | | | | |
|---|---|---|---|---|
| 6,011,394 A | * | 1/2000 | Petropoulos et al. | ......... 324/318 |
| 2010/0244837 A1 | | 9/2010 | Seeber | |

OTHER PUBLICATIONS

German Office Action dated Oct. 26, 2012 for corresponding German Patent Application No. DE 10 2012 203 338.6 with English translation.

* cited by examiner

*Primary Examiner* — Melissa Koval
*Assistant Examiner* — Daniel Miller
(74) *Attorney, Agent, or Firm* — Lempia Summerfield Katz LLC

(57) ABSTRACT

A cylindrical gradient coil arrangement is provided for a magnetic resonance device. The arrangement includes at least one conductive structure that forms at least one gradient coil and a cooling device that uses a cooling fluid to cool the at least one conductive structure. The arrangement includes an outer carrier structure and an inner carrier structure. The outer carrier structure includes two tubular, coaxial outer sections with different diameters. The inner, tubular carrier structure is arranged between and coaxially with the outer sections. The conductive structure is placed on the inner carrier structure. The inner carrier structure is spaced from the outer sections by a clearance. The clearance forms a cooling channel through which the cooling fluid of the cooling device may flow. The inner carrier structure is fastened to the outer carrier structure at least in a point-by-point manner.

16 Claims, 3 Drawing Sheets

CYLINDRICAL GRADIENT COIL ARRANGEMENT FOR A MAGNETIC RESONANCE DEVICE

This application claims the priority benefit of German Patent Application DE 10 2012 203 338.6, filed Mar. 2, 2012, which is hereby incorporated herein in its entirety.

BACKGROUND

The present embodiments relate to a cylindrical gradient coil arrangement for a magnetic resonance device.

Gradient coil arrangements, such as those used in magnetic resonance devices, are known in the prior art. Gradient coil arrangements additionally provide the basic magnetic field with generally linear gradient fields, which restrict excitation to certain slices or as readout gradients. At least in the homogeneity volume of the magnetic resonance device, the gradient coils of the gradient coil arrangement are able to generate the desired fields as precisely as possible. Complex optimization methods are known for designing the current paths and, consequently, the conductive structures, such that the desired fields may be generated considering as many effects as possible.

Therefore, known gradient coils include numerous conductive individual layers that implement the required current density distributions via complex current paths. The different individual layers may be separated from each other by insulation materials and cooling levels. The individual layers of the gradient coils are joined in a gradient coil arrangement and are joined with a casting material (e.g., epoxy resin) to form a composite structure. However, the usually low thermal conductivity of the casting compound limits the efficiency of the heat dissipation.

In addition, the high current intensities used (e.g., up to 1 kA) and the high magnetic fields (e.g., up to 12 T) provided during the operation of the gradient coil arrangement, which may include gradient coils for the x-, y- and z-axes of the magnetic resonance device, result in high Lorentz forces and, consequently, in severe mechanical stress on the carrier apparatus and the conductive structures. Modal vibrations form in the gradient coil arrangement. Due to the large radiating surface of the coil cylinder formed with conventional gradient coil arrangements, the modal vibrations are converted into audible airborne noise.

Known gradient coil arrangements are also problematic because of the complex disposal methods in which the different materials therein are to be mechanically and thermally separated.

In order to achieve adequate cooling, different water cooling levels with a highest possible throughput of cooling medium are used. Also used are materials with the most favorable heat transfer properties and, simultaneously, adequate electric insulation (e.g., epoxy resin). To minimize the sound transmission to the patient, insulating measures have been proposed, such as, for example, melamine foam. The recycling of gradient coil arrangements takes place, for example, by mechanical comminution (e.g., shredding), and by subsequently removing the conductive metals by melting. Complete recycling (e.g., complete separation) is not provided.

SUMMARY AND DESCRIPTION

Known measures do not fulfill the respective objectives to a sufficient degree in gradient coil arrangements. For example, improvements are desirable with respect to sound emissions from gradient coil arrangements.

The present embodiments may obviate one or more of the drawbacks or limitations in the related art. For example, a gradient coil arrangement design that reduces sound output in operation, improves cooling, and facilitates improved recycling may be provided.

In one embodiment, a cylindrical gradient coil arrangement is provided with an outer carrier structure that includes two tubular, coaxial outer sections with different diameters and an inner, tubular carrier structure arranged between and coaxially with the outer sections. The conductive structure is placed on the inner, tubular carrier structure. The inner, tubular carrier structure is spaced apart from the outer sections by a clearance. The clearance forms a cooling channel through which the cooling fluid of the cooling device may flow. The inner carrier structure is fastened to the outer carrier structure at least in a point-by-point manner.

The present embodiments provide a new design for a gradient coil arrangement that uses two carrier structures, the outer carrier structure defining a cooling channel through which the cooling fluid of the cooling device is guided. Hence, the cooling fluid flows directly around the inner carrier structure, which carries the at least one conductive structure (e.g., a plurality of conductive structures), and, thus, around the conductive structures. The fact that the inner carrier structure is not planar or connected via a wide cross section to the outer carrier structure also minimizes the possibility of sound transmission from the inner carrier structure to the outer carrier structure. The gradient coil conductors are consequently placed on a frame made of non-conductive material with high mechanical strength, and the outer carrier structure ultimately forms a jacket that is impervious to liquids.

The gradient coil arrangement may, due to the direct contact between the heat source (the conductive structure) and the cooling medium and the high-volume throughput with a low pressure drop, reduce the noise and vibrations generated by the gradient coil arrangement and improve heat dissipation. Since it is easier to separate the raw materials, the present embodiments may also facilitate a simple and environmentally friendly disposal.

In one embodiment, the inner carrier structure includes a plurality of radial (e.g., uniformly distributed) feed-through openings. Unlike the outer carrier structure, the inner carrier structure does not form a jacket that is impervious to fluids, such that the cooling fluid is able to flow around the carrier sections of the inner carrier structure that forms the feed-through openings and, for example, the conductive structures in order to achieve an optimum cooling effect. In this embodiment, the inner carrier structure may therefore also be understood as a type of "frame" that bears or supports the one or more conductive structures. The diameter of the conductors used for the conductive structure may, for example, be greater than 20 mm$^2$. In one embodiment, the diameter is in the range of 40-60 mm$^2$. These conductor cross sections, which are already commonly used, may provide extremely highly rigid conductive structures so that the conductors do not have to be supported at every point of the conductive structure by the inner carrier structure.

In one embodiment, perpendicular to the radial direction, the inner carrier structure includes a lattice structure and/or an organically grown structure. In the cylindrical plane, a lattice structure (e.g., a bar structure formed from different bars) that supports the conductive structures may, therefore, be provided in the circumferential and longitudinal direction of the cylindrical gradient coil arrangement. Organically grown structures may also or alternatively be used.

The geometric configuration or structure of the target structure may be determined in or using an optimization method such that the target structure withstands the stresses formed during the operation of the magnetic resonance device with a minimal amount surface between the radial feed-through openings. The optimized structure may be determined based on the conductor track distribution of the conductive structure and/or operational parameters of the magnetic resonance device in, for example, a simulation.

When the inner carrier structure has a closed surface and vibrations are triggered by the currents in the conductive structure, a pumping effect may be exerted on the cooling fluid that may result in strong mechanical stresses on both the inner carrier structure and, in some circumstances, the outer carrier structure. By providing an inner carrier structure that includes feed-through openings, this pumping effect may be avoided, and the remaining "working surface" of the inner carrier structure is minimized, while the inner carrier structure is still sufficiently stable and provides support for the conductive structure during the usual operation of the gradient coil arrangement or the magnetic resonance device.

The stresses to be absorbed may be considered to be the target function of an optimization to be performed that determines the geometric structure of the inner carrier structure while minimizing coherent areas.

In another embodiment, the outer sections of the outer carrier structure may include a plurality of radial feed-through openings (e.g., uniformly distributed radial feed-through openings). The openings may be sealed to the outside with a jacket (e.g., a film) to terminate the gradient coil arrangement. The jacket, which is impervious to fluids, may be, for example, a thick plastic film covering the feed-through openings of the outer sections of the outer carrier structure, which may also have a lattice structure. Accordingly, the jacket impervious to fluids is softer and less rigid, such that acoustic vibrations in the overall arrangements may be further reduced.

In the embodiment in which the inner carrier structure is a lattice-like inner carrier structure, the lattice constant of the outer sections is greater than the lattice constant of the inner carrier structure. This causes the outer structure to be softer overall (e.g., with regard to sound excitations) since the outer sections ultimately has a smaller bearing effect per surface section than the inner carrier structure.

In addition, a sound decoupling device may be provided between the inner carrier structure and the outer carrier structure. Therefore, if, for example, a point-by-point connection is provided between the outer carrier structure and the inner carrier structure, sound decoupling by or using a sound decoupling device may be provided at these points so that vibrations from the inner carrier structure are not transmitted by the connecting elements, or are, at most, only transmitted in greatly attenuated form. The sound decoupling device may, for example, be or include a foam-like material (e.g., a polyurethane material). Suitable materials such as "Sylomer" and "Sylodyn" may be obtained from, for example, Getzner Werkstoffe GmbH, Bürs, Austria.

Cases may occur in which the transmission of vibrations via the cooling fluid may not be completely overlooked. For example, the basic (flexural) vibration of a cylindrical gradient coil structure from water is about 200 Hz since water has a viscosity of about 1 mPa*s. A kind of "residual resonance" of the gradient coil arrangement remains that, following sound transmission via the cooling fluid, is quite capable of resulting in the development of noise.

To resolve this problem, in one embodiment, the cooling fluid may be an electrorheological fluid, and at least one planar electrode may be provided on each of the outer sections and/or the film covering the feed-through openings of the outer sections. Electrorheological fluids are materials with flow characteristics such as, for example, a viscosity that may be adjusted reversibly by an electric field. For example, an electrorheological fluid may include an electrically insulating fluid in which non-conductive microparticles and/or nanoparticles are dissolved. The application of an electric voltage results in a change in viscosity on, for example, an order of magnitude of up to $10^6$ (Winslow effect), within a few milliseconds. This also causes a change in the acoustic velocity of the electrorheological fluid, thereby changing the frequency of the modal vibrations of the gradient coil arrangement.

When an electrorheological fluid is used as a cooling fluid and, simultaneously, planar electrodes are provided on the outer sections, an electric field may be generated in the cooling channel between the outer sections, causing the viscosity properties and, hence, the vibration properties of the cooling fluid to change. The planar electrodes, which are deposited on the jacket that is impervious to fluids with large and small diameters, are, accordingly, connected to an adjustable voltage source.

In one embodiment, a control device is provided that is configured to apply a voltage to the electrodes arranged on both sides of the cooling channel based on operating information for the gradient coil arrangement. Prior to the start of a magnetic resonance sequence, the dominant frequency components may, for example, be initially determined. Now, if the sound spectrum or vibration spectrum of the gradient coil, which may be determined by, for example, a tune-up measurement and/or by simulation, is known, the sound or vibration spectrum may be displaced relative to the exciting frequencies such that excitation of the main resonances is avoided or minimized. The displacement of the sound and vibration spectrum of the gradient coil arrangement may be performed by converting the required displacement frequency into an electrode voltage for the planar electrodes. In this way, the generation of sound and vibration by the gradient coil arrangement may be individually minimized for each magnetic resonance sequence. The residual resonances of the overall structure of the gradient coil arrangement are, consequently, always displaced such that even the residual material rigidity and geometric rigidity do not result in strong excitation.

In order to avoid electric breakdowns and the like, an electrorheological fluid with high-voltage strength may be selected. For example an electrorheological fluid with high-voltage strength of at least 2 kV may be selected.

In some embodiments, the inner carrier structure and/or the outer carrier structure may at least partially include a carbon-fiber material.

In another embodiment, a magnetic resonance device that includes any of the cylindrical gradient coil arrangements described herein may be provided. All the advantages of the cylindrical gradient coil arrangement may be transferred analogously to the magnetic resonance device.

DETAILED DESCRIPTION OF THE DRAWINGS

Figure 1:
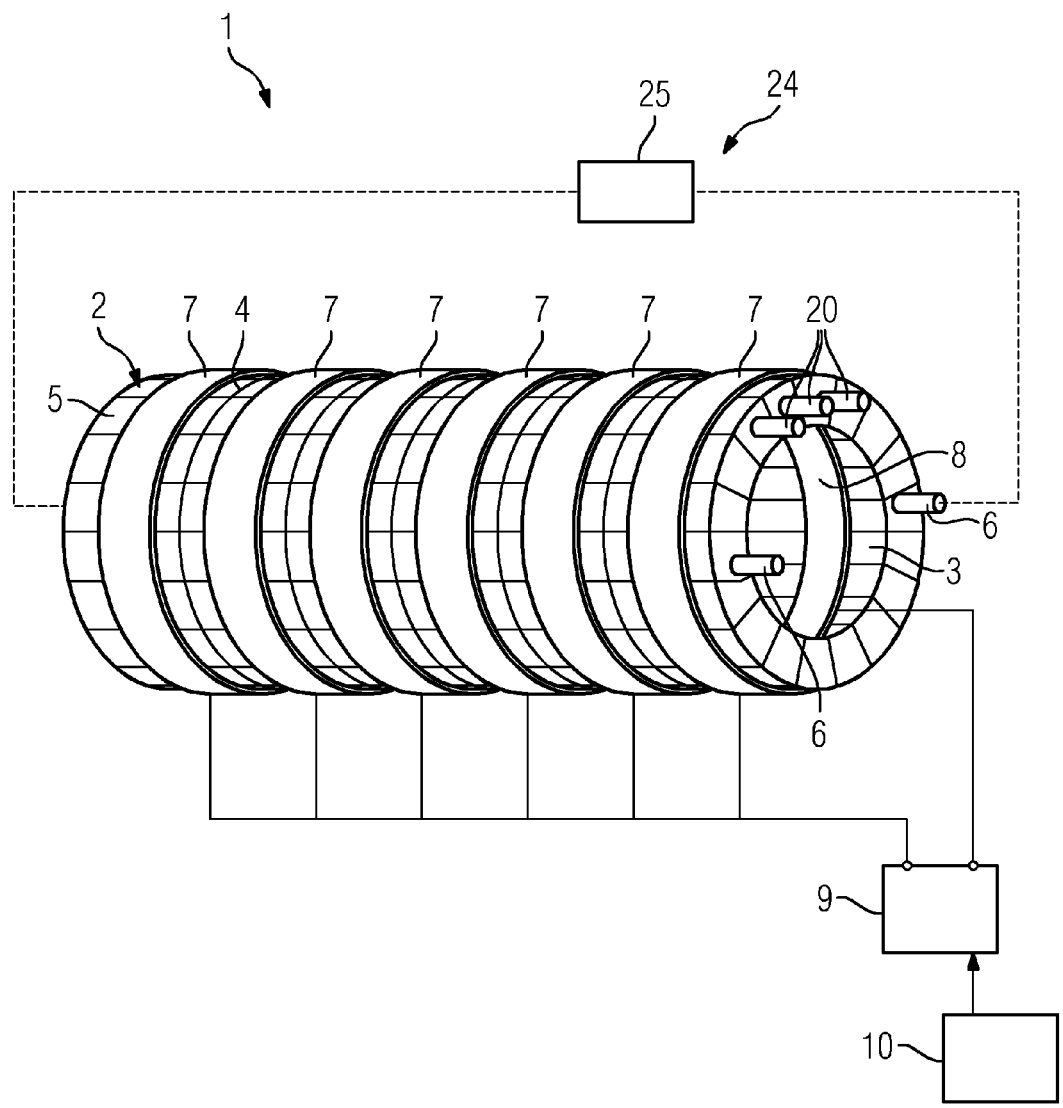
FIG. 1 shows an exterior view of one embodiment of a gradient coil arrangement.

FIG. 1 shows an exterior view of one embodiment of a gradient coil arrangement 1. The gradient coil arrangement 1 is a substantially hollow cylinder with an interior space that may not be seen in FIG. 1. The interior space lies between an outer section 2 with a larger radius and an outer section 3 with a smaller radius than the outer section 2. The outer structure, which includes the outer sections 2 and 3, is formed by a lattice-like outer carrier structure 4. The feed-through openings formed between the lattice bars (e.g., made of carbon fibers) are closed in a liquid-tight manner by a plastic film 5 that encloses the outside of the gradient coil arrangement 1. In this way, a cooling channel is formed between the outer sections 2, 3, into which an electrorheological cooling fluid may flow through inlets 6. The cooling fluid may leave the cooling channel via corresponding outlets on the opposite side. The complete cooling circuit of the cooling device 24 is only briefly indicated in FIG. 1. The cooling device 24 includes, for example, a heat exchanger 25 that dissipates the waste heat from the gradient coil conductors.

As FIG. 1 also shows, a plurality of electrodes 7, 8 is provided on the outer sections 2, 3, respectively. Via each of the electrodes 7, 8, an electric field that changes the viscosity properties of the electrorheological cooling fluid in the cooling channel may be established, further details of which will be described below. As is only indicated in FIG. 1, the electrodes 7, 8 are correspondingly connected to an adjustable voltage source 9 that may be controlled by a control device 10 of a magnetic resonance device, to which the cylindrical gradient coil arrangement 1 belongs, according to the actual sequence (e.g., the actual gradient pulses).

Figure 2:
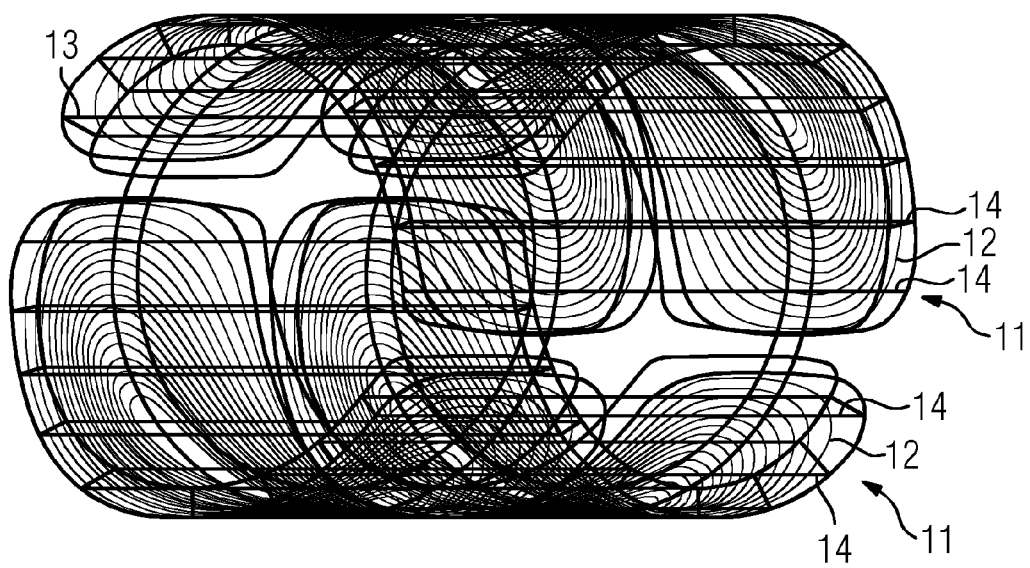
FIG. 2 shows one embodiment of an inner carrier structure with conductive structures.

FIG. 2 shows a perspective view of one embodiment of an inner carrier structure 11 that carries the conductive structures 12 of the gradient coils. The conductive structures 12 are arranged in a plurality of individual layers. In one embodiment, the gradient coils are provided for the x-, the y- and z-directions, and each gradient coil includes two saddle-like conductive structures 12. For purposes of clarity, not all conductor tracks of the conductive structures 12 are shown in FIG. 2. The conductive structures 12 are fastened to lattice bars 13 (e.g., made of carbon fibers) of the inner carrier structure 11. The lattice constant of the inner carrier structure 11 in the individual layers is smaller than the lattice constant of the outer carrier structure 4. In one embodiment, the individual layers and, therefore, lattices with different radii, are connected by non-positively connecting ribs 14.

The lattice constant of the inner carrier structure 11 may be selected such that the stresses formed during the operation of the gradient coil arrangement may be absorbed, but the smallest possible coherent surfaces are occupied by the lattice bars 13. In one embodiment, an empirically optimized structure such as an organically grown structure determined in an optimization method with a corresponding target function may be used.

Figure 3:
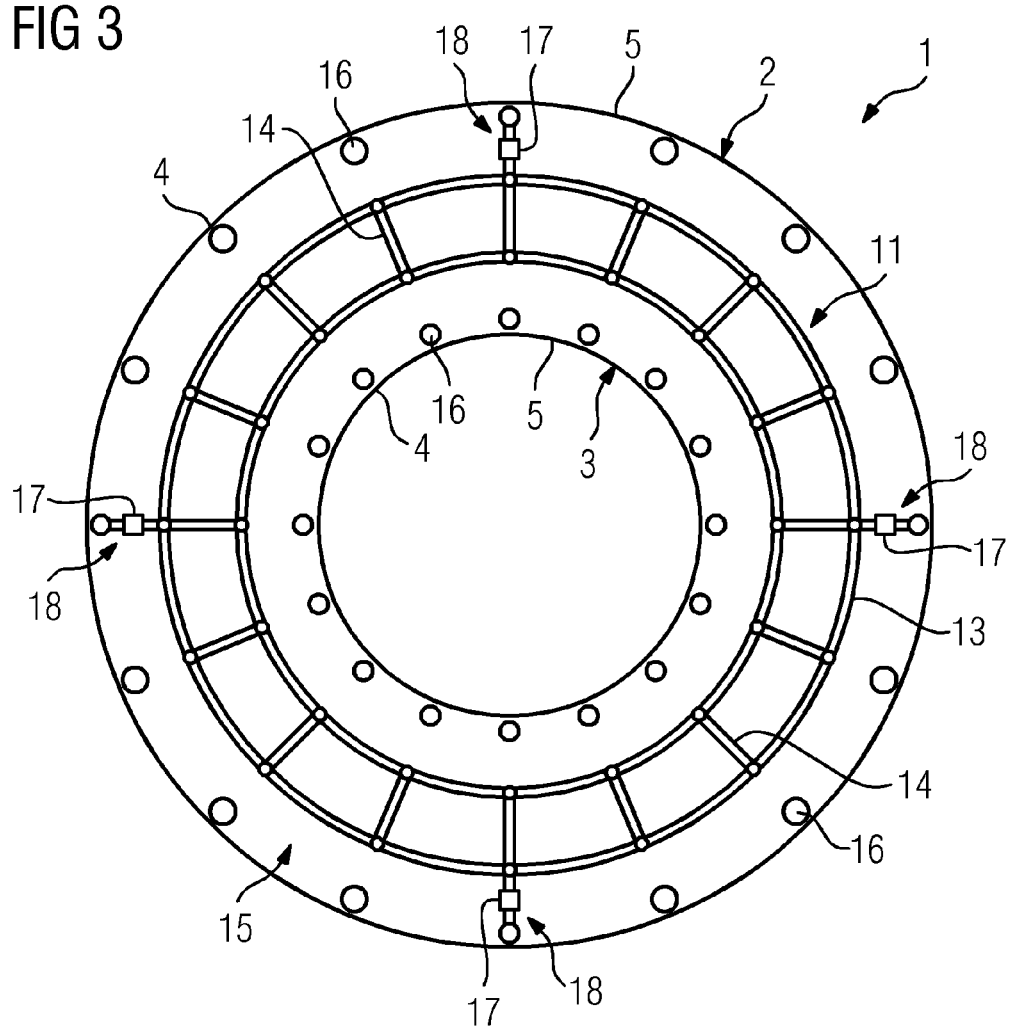
FIG. 3 is a cross section of the gradient coil arrangement of FIG. 1.

As shown in FIG. 3, which depicts a cross-section of the gradient coil arrangement 1, the inner carrier structure 11 is held in the cooling channel 15 between the outer sections 2, 3. FIG. 3 depicts the outer carrier structure 4 with longitudinal lattice bars 16. The film 5 seals the arrangement 1 from the outside. The inner carrier structure 11 with the conductive structures 12 (which are not shown here for purposes of clarity) is disposed between the outer sections 2, 3. Connections 18 with sound decoupling devices 17 hold the inner carrier structure on the outer carrier structure 4 in a point-by-point manner. In one embodiment, the sound decoupling devices 17 include or are made of a foam-like polyurethane material in order not to transmit vibrations of the inner carrier structure 11 to the outer carrier structure 4.

The sound and vibration spectrum of the gradient coil arrangement 1 that avoids or reduces vibration of the gradient coil arrangement 1 caused by the electrorheological fluid filling the cooling channel 15 is, for example, determined by measurement and/or simulation. When a magnetic resonance sequence with gradient pulses is used, dominant frequency components of the magnetic resonance sequence are determined. The application of certain voltages to the electrodes 7 and 8 (which are not shown in any more detail for purposes of clarity in FIG. 3) via the adjustable voltage source 9 changes the properties of the electrorheological fluid such that the sound and vibration spectrum of the gradient coil arrangement 1 is displaced with respect to the exciting frequencies such that excitation of the main resonances is avoided or minimized. The required displacement frequency may be converted into a voltage for the electrodes 7, 8. The required displacement frequency may, for example, be converted by the control device 10.

With the help of the feed-through openings of the lattice of the inner carrier structure 11, the structure of the gradient coil arrangement 1 provides excellent cooling due to the currents flowing into the conductive structures 12 and reduces the transmission of vibrations from the inner carrier structure 11 because of the small coherent surface of the inner carrier structure 11 and due to the fact that the properties of the electrorheological fluid, in which the conductive structures 12 and the inner carrier structure 11 are arranged, may be selectively changed. Excellent cooling and excellent sound and vibration behavior are thus possible in the present embodiments. In addition, the gradient coil arrangement 1 is easy to dismantle and, hence, is environmentally-friendly (e.g., it may be recycled easily).

As the electrorheological fluid is guided from the outside, via the inlets 6, electrical connectors 20 may also be provided for the gradient coils (see FIG. 1). For example, one electrical connector 20 may be provided for each gradient coil assigned to the x-axis, the y-axis and the z-axis.

Figure 4:
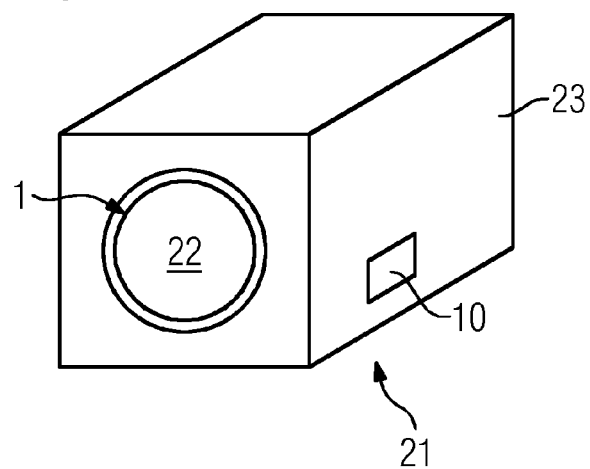
FIG. 4 shows an exemplary magnetic resonance device.

FIG. 4 shows one embodiment of a magnetic resonance device 21. FIG. 4 shows the main magnet field unit 23 of the cylindrical gradient coil arrangement 1 inside the cylindrical patient receptacle 22.

While the present invention has been described above by reference to various embodiments, it should be understood that many changes and modifications may be made to the described embodiments. It is therefore intended that the foregoing description be regarded as illustrative rather than limiting, and that it be understood that all equivalents and/or combinations of embodiments are intended to be included in this application.

The invention claimed is:

1. A cylindrical gradient coil arrangement for a magnetic resonance device, the cylindrical gradient coil arrangement comprising:
    at least one conductive structure that forms at least one gradient coil;
    a carrier apparatus carrying the at least one conductive structure, the carrier apparatus comprising an outer carrier structure and an inner, tubular carrier structure; and
    a cooling device coupled to the carrier apparatus operable to supply a cooling fluid to cool the at least one conductive structure, wherein the outer carrier structure comprises two tubular, coaxial outer sections having different diameters, wherein the inner, tubular carrier structure is arranged coaxially between the outer sections and spaced apart from the outer sections by a clearance, the conductive structure being placed on the inner carrier structure, and wherein the clearance forms a cooling channel through which the cooling fluid of the cooling device is flowable, wherein the inner carrier structure and the at least one conductive structure provide a plurality of feed-through openings arranged in a radial direction of the inner carrier structure through which the cooling fluid of the cooling device is flowable, and the inner carrier structure is fastened to the outer carrier structure at least in a point-by-point manner.

2. The cylindrical gradient coil arrangement as claimed in claim 1, wherein the plurality of feed-through openings are uniformly distributed in the radial direction of the inner carrier structure.

3. The cylindrical gradient coil arrangement as claimed in claim 1, wherein the inner carrier structure comprises a lattice structure.

4. The cylindrical gradient coil arrangement as claimed in claim 1, wherein the two tubular, coaxial outer sections each comprise a plurality of feed-through openings arranged along a radial direction of the two tubular, coaxial outer sections, the plurality of feed-through openings being covered by a film to terminate the cylindrical gradient coil arrangement.

5. The cylindrical gradient coil arrangement as claimed in claim 4, wherein the cooling fluid is an electrorheological fluid, and wherein the cylindrical gradient coil arrangement further comprises at least one planar electrode provided on each of the two tubular, coaxial outer sections, the film covering the plurality of feed-through openings of a tubular, coaxial outer section having the largest diameter of the two tubular, coaxial outer sections, or a combination thereof.

6. The cylindrical gradient coil arrangement as claimed in claim 5, further comprising a control device configured to apply a voltage to the at least one planar electrode provided on each of the two tubular, coaxial outer sections based on operating information for the cylindrical gradient coil arrangement.

7. The cylindrical gradient coil arrangement as claimed in claim 5, wherein the electrorheological fluid has a high-voltage strength of at least 2 kV.

8. The cylindrical gradient coil arrangement as claimed in claim 6, wherein the electrorheological fluid has a high-voltage strength of at least 2 kV.

9. The cylindrical gradient coil arrangement as claimed in claim 1, wherein the two tubular, coaxial outer sections each comprise a plurality of feed-through openings arranged along a radial direction of the two tubular, coaxial outer sections, the plurality of feed-through openings of a tubular, coaxial outer section having a largest diameter of the two tubular, coaxial outer sections being covered by a film to seal the cylindrical gradient coil arrangement.

10. The cylindrical gradient coil arrangement as claimed in claim 9, wherein each of the two tubular, coaxial outer sections has a lattice structure.

11. The cylindrical gradient coil arrangement as claimed in claim 1, further comprising a sound decoupling device provided between the inner carrier structure and at least a portion of the outer carrier structure.

12. The cylindrical gradient coil arrangement as claimed in claim 11, wherein the sound decoupling device comprises a foam-like material.

13. The cylindrical gradient coil arrangement as claimed in claim 12, wherein the foam-like material comprises a polyurethane material.

14. The cylindrical gradient coil arrangement as claimed in claim 1, wherein the inner carrier structure or the outer carrier structure at least partially comprises a carbon-fiber material.

15. The cylindrical gradient coil arrangement as claimed in claim 1, wherein the inner carrier structure and the outer carrier structure each at least partially comprise a carbon-fiber material.

16. A magnetic resonance device comprising:
a cylindrical gradient coil arrangement comprising:
at least one conductive structure that forms at least one gradient coil;
a carrier apparatus carrying the at least one conductive structure, the carrier apparatus comprising an outer carrier structure and an inner, tubular carrier structure; and
a cooling device coupled to the carrier apparatus operable to supply a cooling fluid to cool the at least one conductive structure,
wherein the outer carrier structure comprises two tubular, coaxial outer sections having different diameters,
wherein the inner, tubular carrier structure is arranged coaxially between the outer sections and spaced apart from the outer sections by a clearance, the conductive structure being placed on the inner carrier structure, and
wherein the clearance forms a cooling channel through which the cooling fluid of the cooling device is flowable, wherein the inner carrier structure and the at least one conductive structure provide a plurality of feed-through openings arranged in a radial direction of the inner carrier structure through which the cooling fluid of the cooling device is flowable, and the inner carrier structure is fastened to the outer carrier structure at least in a point-by-point manner.

* * * * *